United States Patent [19]

Nishitani

[11] Patent Number: 4,626,828
[45] Date of Patent: Dec. 2, 1986

[54] ADAPTIVE PREDICTIVE CODE CONVERSION METHOD OF INTERRUPTING PREDICTION AND AN ENCODER AND A DECODER FOR THE METHOD

[75] Inventor: Takao Nishitani, Tokyo, Japan

[73] Assignee: NEC, Tokyo, Japan

[21] Appl. No.: 635,991

[22] Filed: Jul. 30, 1984

[30] Foreign Application Priority Data

Jul. 29, 1983 [JP] Japan ................................. 58-139019

[51] Int. Cl.⁴ ............................................. H03K 13/22
[52] U.S. Cl. ............................. 340/347 DD; 375/30; 332/11 D; 358/135
[58] Field of Search ............... 340/347 DD; 358/135; 375/30; 332/11 D

[56] References Cited

U.S. PATENT DOCUMENTS 4,133,006  1/1979  Iinuma ........................ 340/347 DD
4,200,886  4/1980  Musmann et al. ................. 358/135
4,554,670  11/1985  Aiko et al. ........................ 332/11 D Primary Examiner—Michael L. Gellner
Assistant Examiner—David M. Gray
Attorney, Agent, or Firm—Sughrue, Mion, Zinn, Macpeak & Seas

[57] ABSTRACT

In an adaptive encoder encoding an encoder input signal into an encoder output signal by carrying out adaptive prediction, an encoder calculation circuit calculates electric power of an encoder electric signal related to the encoder input signal and the encoder output signal. The adaptive prediction is interrupted by an encoder interruption circuit when the electric power is not greater than a reference electric power. The electric signal may be either the encoder input signal or the encoder output signal. Preferably, a local decoded signal is monitored as the encoder electric signal by the encoder calculation circuit. When adaptive quantization is carried out in the encoder, an adaptive step size may be given as the electric signal to the encoder calculation circuit. An adaptive decoder comprises a decoder calculation circuit for calculating electric power of a decoder electric signal related to either a decoder input signal or a decoder output signal in a manner similar to the encoder calculation circuit. A decoder interruption circuit interrupts adaptive operation in the decoder like the encoder interruption circuit.

26 Claims, 7 Drawing Figures

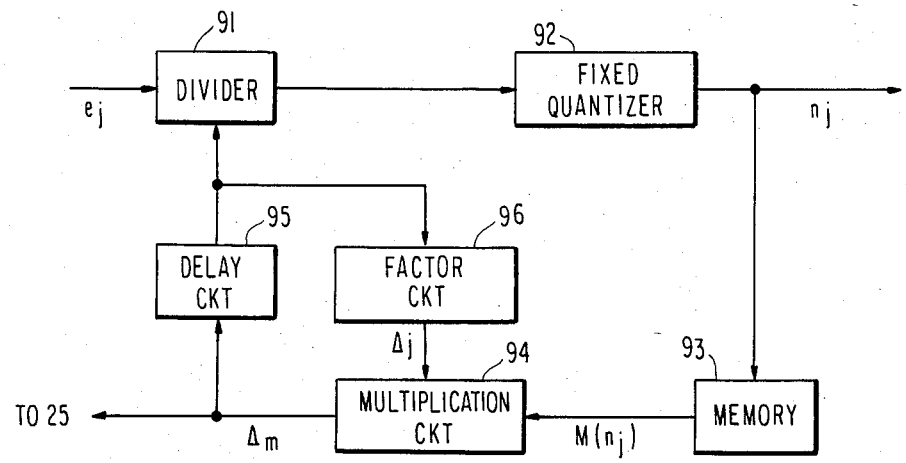
FIG. 6
FIG. 7
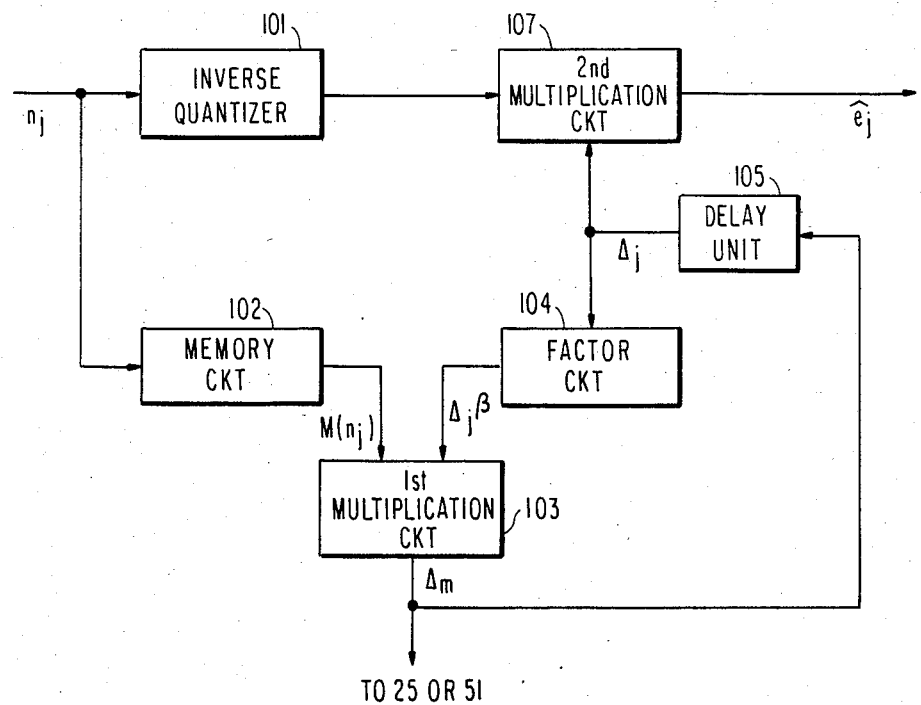

ADAPTIVE PREDICTIVE CODE CONVERSION METHOD OF INTERRUPTING PREDICTION AND AN ENCODER AND A DECODER FOR THE METHOD

BACKGROUND OF THE INVENTION

This invention relates to a method of carrying out conversion between first and second signal successions from one to the other in an adaptive predictive pulse code modulation (ADPCM) system and to an adaptive predictive encoder and decoder in which the method is used.

In ICASSP 82 Proceedings, Volume 2 (May 1982), pages 960–963, T. Nishitani et al describe under the title of "A 32 kb/s Toll Quality ADPCM Codec using a Single Chip Signal Processor," two types of adaptive predictive conversion systems each of which comprises an encoder and a decoder and which carries out adaptive quantization and adaptive prediction in the encoder and the decoder. Different algorithms are used in both of the conversion systems on the adaptive prediction. The adaptive prediction successively proceeds in both systems by the use of an adaptive predictive portion having a feedback loop and a plurality of prediction coefficients adaptively varied through the feedback loop.

It is desirable that an internal state of the encoder quickly becomes equal to, namely, coincides with that of the decoder. However, existence of the feedback loop makes the quick coincidence difficult once incoincidence takes place between the internal states of the encoder and the decoder for some reason or another. In other words, an incoincident duration becomes long with each of the systems.

Interaction between the adaptive quantization and the adaptive prediction makes the incoincident duration longer and longer with an increase of the number of the prediction coefficients.

Exact coincidence between the internal states of the encoder and the decoder is strictly required in a conversion system of multiple stages wherein ADPCM encoding and decoding are successively repeated to transmit a nonlinear PCM signal based on CCITT recommendation G 712. Although such a multiple-stage conversion system is described by H. Murakami in Proceedings of 1979 ISCAS, Pages 969–970, under the title of "A Low Noise ADPCM-LogPCM Code Converter," no description is directed towards quick coincidence of internal states between an ADPCM encoder and an ADPCM decoder of each stage. As a result, each code is gradually degraded at every stage.

SUMMARY OF THE INVENTION

It is an object of this invention to provide a method of carrying out code conversion, wherein quick coincidence of internal states is possible for both encoding and decoding.

It is another object of this invention to provide a method of the type descrired, wherein a code is not degraded even in a multiple-stage conversion system.

It is a further object of this invention to provide an ADPCM encoder for use in carrying out the method.

It is a further object of this invention to provide an ADPCM decoder for use in cooperating with the above-mentioned encoder.

According to this invention, a code conversion method is for carrying out conversion between a succession of first signals and a succession of second signals by the use of adaptive prediction means for successively carrying out adaptive prediction on the first signal succession to produce a succession of prediction signals predictive of the first signal succession. The method comprises the steps of calculating electric power of an electric signal succession related to a preselected one of the first and the second signal successions to produce a power signal representative of the electric power and interrupting said adaptive prediction when the electric power is not greater than a preselected electric power.

BRIEF DESCRIPTION OF THE DRAWING

FIG. 6 is a block diagram of an adaptive quantizer for use in each of the encoders illustrated in FIGS. 1 and 4 and in another code conversion method; and FIG. 7 is a block diagram of an adaptive inverse quantizer for use in each encoder and decoder illustrated in FIGS. 1, 2, 4, and 5 and also in a modified code conversion method.

DESCRIPTION OF THE PREFERRED EMBODIMENTS

Figure 1:
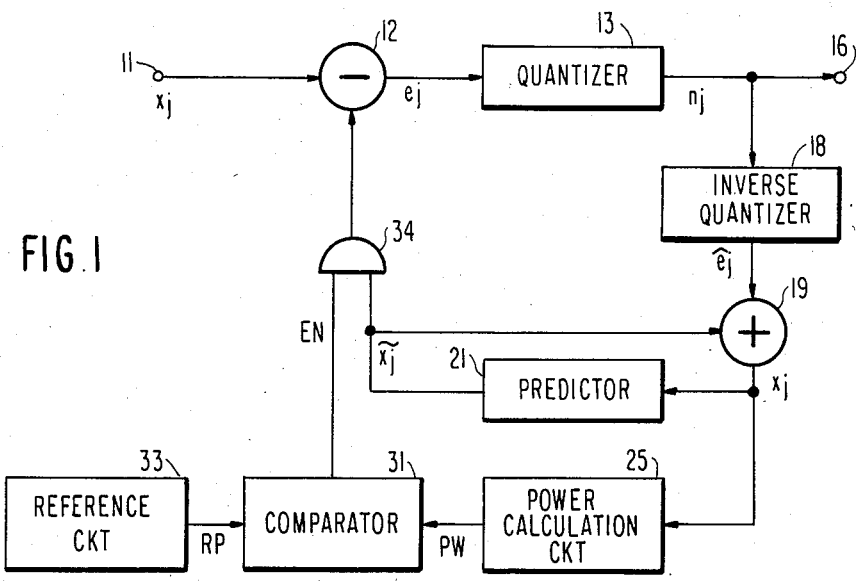
FIG. 1 is a block diagram of an adaptive encoder for use in carrying out a conversion method according to a first embodiment of this invention.
Figure 2:
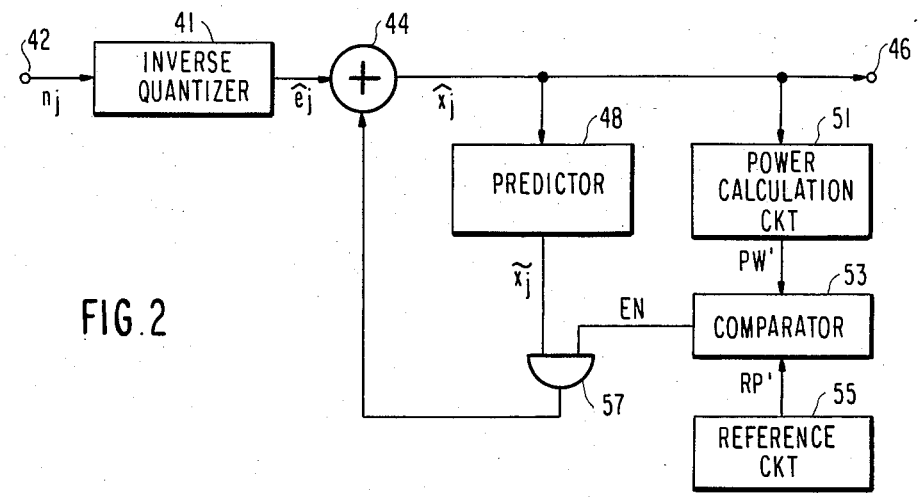
FIG. 2 is a block diagram of an adaptive decoder for use in combination with the encoder illustrated in FIG. 1.

Referring to FIGS. 1 and 2, a conversion method according to a first embodiment of this invention carries out encoding and decoding by the use of an adaptive encoder (FIG. 1) and an adaptive decoder (FIG. 2), respectively. In FIG. 1, the adaptive encoder is supplied through an encoder input terminal 11 with a succession of encoder input signals represented by a current one $x_j$ of the encoder input signals, where j represents a current sampling instant. The subscript j will be added when description is related to the current time instant. Otherwise, the subscript j will be omitted. The encoder input signal succession x is subjected to PCM in a known manner and may be referred to as a first digital signal succession.

A subtractor 12 subtracts a succession of prediction signals specified by $\tilde{x}$ (to be later described) from the encoder input signal succession x to deliver a succession of error signals e to an adaptive quantizer 13 which may be called a forward quantizer, as will become clear later.

Let each of the error signals e have a bit length of L, where L is representative of a natural number. The quantizer 13 quantizes the error signals e in a known manner into a succession of quantized signals each of which has a bit length of N. The number N is smaller than L. For example, the current error signal $e_j$ is quantized with reference to threshold values which is equal in number to $2^{N-1}$. The current error signal $e_j$ is given by:

$$n_j\Delta_j \leqq e_j < (n_j 1)\cdot\Delta_j, \tag{1}$$

where $\Delta_j$ represents an adaptive quantizing step, namely, a step size at the current sampling instant j and $n_j$ represents a value or a quantized code selected from a group of $(0, \pm1, \pm2, \ldots, \pm(2^{N-1}-1)$, and $-2^{N-1})$.

A Formula (1) holds as regards the current error signal $e_j$, the adaptive quantizer 13 produces the current one $n_j$ of the quantized signals that is given by the selected quantized code $n_j$. With reference to the current quantized signal $n_j$, the step size $\Delta_j$ is varied at the following sampling instant (j+1) to a succeeding or subsequent step size $\Delta_{j+1}$ given by:

$$\Delta_{j+1} = \Delta_j^\beta \cdot M(n_j), \tag{2}$$

where $\beta$ represents a preselected number near to and less than one and $M(n_j)$, a multiplier uniquely determined by the selected quantized code $n_j$. The step size $\Delta_j$ may be called a step size coefficient. Table 1 exemplifies a variety of such multipliers which are for use in encoding an audio signal or a speech signal sampled by sampling pulses having a sampling frequency of 8 KHz into four bits (N=4).

TABLE 1

| $n_j$ | $M(n_j)$ |
|---|---|
| 0 | 0.8 |
| ±1 | 0.8 |
| ±2 | 0.8 |
| ±3 | 0.8 |
| ±4 | 1.2 |
| ±5 | 1.6 |
| ±6 | 2.0 |
| ±7 | 2.4 |
| −8 | 2.4 |

When the step size coefficient $\Delta$ is adaptively varied in accordance with Equation (2), the quantizer 13 becomes robust against a transmission error as pointed out by Goodman et al in IEEE Transactions on Communications, November 1975, pages 1362-1365, under the title of "A Robust Adaptive Quantizer."

The quantized signals n are produced through an encoder output terminal 16 as a succession of encoder output signals each of which has N bits and which may be referred to as a second digital signal succession.

The quantized signals n are delivered from the quantizer 13 to an inverse quantizer 18 which may be referred to as an encoder inverse quantizer. The inverse quantizer 18 inversely quantizes the quantized signals n into a succession of reproduced difference signals which are representative of reproductions of the difference signals and each of which has L bits. Inverse quantization is adaptively carried out in accordance with an inverse quantization algorithm given by:

$$\hat{e}_j = n_j\Delta_j + 0.5\Delta_j. \tag{3}$$

The reproduced difference signal succession ê is given to an adder 19 to produce a succession of local signals $\hat{x}$ representative of local reproductions of the encoder input signal succession x in a manner to be presently described, respectively. Thus, a combination of the inverse quantizer 18 and the adder 19 serves to produce the local signal succession $\hat{x}$ in response to the encoder output signal succession n and may therefore be called a local signal production circuit.

Although the details are not depicted, it is known in the art that a predictor 21, which may be named an encoder predictor, comprises a plurality of taps, delay units connected between two adjacent taps so as to delay the local signal succession $\hat{x}$, a gain control circuit for adaptively producing prediction coefficients assigned to the respective taps, multipliers for calculating products between the prediction coefficients and tap signals derived from the taps, respectively, and an adder circuit for summing up the products. The sums of the products are successively produced as the prediction signal succession $\bar{x}$. Each of prediction signals $\bar{x}$ is predictive of each of the encoder input signals x. Let the predictor 21 have a transfer function P(z) given by:

$$P(z) = \sum_{i=1}^{k} a_i^j z^{-i}, \tag{4}$$

where $a_i^j$ represents the prediction coefficient assigned to an i-th one of the taps at the current sampling instant j. As readily understood from Equation (4), the transfer function P(z) is represented by the use of z-transform. Each prediction coefficient $a_i^j$ is adaptively modified at the following sampling instant (j+1) into $a_i^{j+1}$ given by:

$$a_i^{j+1} = (1-\delta)a_i^j + ge_j\hat{x}_{j-i}, \tag{5}$$

where each of $\delta$ and g is representative of a positive constant smaller than one. This means that each prediction coefficient $a_i^j$ is modified so that a square of $\hat{e}_j$, namely, electric power of the reproduced difference signal $\hat{e}_j$ becomes minimum.

The prediction signal succession $\bar{x}$ is successively fed back to the adder 19 supplied with the reproduced difference signal succession ê. As a result, the adder 19 produces the local signal succession $\hat{x}$ as mentioned before. The prediction signal succession $\bar{x}$ is delivered to the subtractor 12 in a manner to be described later.

The above-mentioned structure is similar to one of the conventional predictive encoder described in the Nishitani et al article referenced in the preamble of the instant specification.

In FIG. 1, the local signal succession $\hat{x}$ is delivered to a power calculation circuit 25 which may be called an encoder calculation circuit. The local signal succession $\hat{x}$ is related to the quantized, namely, encoder output signal succession n and may be named an electric signal succession. The illustrated power calculation circuit 25 monitors the local signal succession to calculate electric power of the local signal succession $\hat{x}$ and to produce a power signal PW representative of the electric power.

Figure 3:
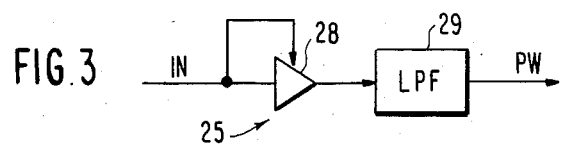
FIG. 3 is a block diagram of a power calculation circuit for use in either of the encoder and the decoder illustrated in FIGS. 1 and 2.

Temporarily referring to FIG. 3, the power calculation circuit 25 is supplied as a succession of input signals IN with the local signal succession $\hat{x}$. A multiplier 28 squares each input signal IN to supply a low pass filter 29 with a square signal representative of a square of each input signal IN. A d.c. component is derived from the square signal by the low pass filter 29 to be produced as the power signal PW. The low pass filter 29 may be a filter described by L. R. Rabiner et al in "Theory and Application of Digital Signal Processing" (1975) published by Prentice-Hall. More specifically, the low pass filter may be a first-order low pass filter specified by;

$$y(n+1) = x(n+1) + y(n)\cdot exp(-1/\tau),$$

where $\tau$ represents a time constant; x, an input signal; and y, an output signal.

Referring back to FIG. 1, the power signal PW is sent to a comparator 31 supplied from a reference circuit 33 with a reference power signal RP representative of reference power. The reference power may be, for example, $-50$ dBm or so. The comparator 31 compares the electric power signal PW with the reference power signal RP to supply an AND gate 34 with an enable signal EN when the electric power of the power signal PW is greater than the reference power. Stated otherwise, the AND gate 34 is put into a disabled state when the former is equal to or less than the latter. During the disabled state, none of the prediction signal succession $\bar{x}$ is given to the subtractor 12 and adaptive prediction is therefore stopped or interrupted. Thus, a combination of the comparator 31, the reference circuit 33, and the AND gate 34 serves to interrupt the adaptive prediction and may be referred to as an encoder interruption circuit. The comparator 31, the reference circuit 33, and the AND gate 34 may be called an encoder comparator, an encoder reference circuit, and an encoder AND gate, respectively. The reason why the adaptive prediction is stopped will be described with reference to FIG. 2. It is to be noted here that the encoder predictor 21 is put into operation together with the quantizer 13 and the inverse quantizer 18 during the interruption of prediction. Thus, the interruption of prediction results from prohibition of the prediction signals $\bar{x}$.

In FIG. 2, the illustrated decoder comprises an inverse quantizer 41 which is supplied with a succession of decoder input signals through a decoder input terminal 42 and which may be called a decoder inverse quantizer. The decoder input signal succession is equal to the encoder output signal succession n insofar as no transmission error is introduced into the encoder output signal succession n. The decoder input signal succession may therefore be referred to as the second signal succession and is denoted by n.

The decoder inverse quantizer 41 adaptively carries out inverse quantization in accordance with Equation (3) in a manner described in conjunction with the encoder inverse quantizer 18. As a result, the decoder input signal succession n is inversely quantized into a succession of regenerated difference signals which is a regeneration of the difference signal succession e and which is therefore represented by $\hat{e}$, like the reproduced difference signal succession e produced in the encoder (FIG. 1).

An adder circuit 44 adds each of the regenerated difference signals $\hat{e}$ to each of regenerated prediction signals produced in a manner to be described later. Each regenerated prediction signal is a regeneration of each prediction signal $\bar{x}$ illustrated in FIG. 1 and is represented by $\bar{x}$.

A succession of decoded signals is supplied as a decoder output signal succession from the adder circuit 44 through a decoder output terminal 46 in a manner similar to that described in conjunction with the local signal succession $\hat{x}$ and is therefore represented by $\hat{x}$ like the local signal succession. The decoded signal succession $\hat{x}$ is also supplied to a decoder predictor 48 operable in the manner described in conjunction with the encoder predictor 21. Accordingly, the decoder predictor 48 has the transfer function P(z) represented by Equation (4) and the prediction coefficients adaptively modified in accordance with Equation (5). Such adaptive modification of the prediction coefficients is carried out so that the electric power of each regenerated difference signal $\hat{e}$ becomes minimum, as mentioned before.

The illustrated decoder comprises a power calculation circuit 51 which may be called a decoder calculation circuit. The decoder calculation circuit 51 is similar in operation and structure to the encoder calculation circuit 25 illustrated in FIG. 3 and calculates electric power of the decoded signal succession $\hat{x}$ to produce a power signal PW. The power signal is compared by a decoder comparator 53 with a reference power signal RP' sent from a decoder reference circuit 55. The decoder comparator 53 and the decoder reference circuit 55 are similar to the encoder comparator 31 and the encoder reference circuit 33 illustrated with reference to FIG. 2, respectively. Like in FIG. 1, a result of comparison is sent to an encoder AND gate 57 to enable the same only when the power signal PW' is greater in electric power than the reference power signal RP'. Thus, a combination of the decoder comparator 53, the decoder reference circuit 55, and the decoder AND gate 57 serves to interrupt adaptive prediction of the decoder predictor 48 when the electric power of the decoded signal succession $\hat{x}$ is not greater than reference electric power determined by the reference power signal RP'. Therefore, the combination may be named a decoder interruption circuit. It should be noted that the decoder predictor 48 continues to operate even during the interruption of prediction of the decoder, like the encoder predictor 21.

It will at first be assumed that neither the encoder nor the decoder comprises the power calculation circuit and the interruption circuit, as is the case with the conventional encoder and decoder. Under the circumstances, let the reproduced difference signal $\hat{e}_j$, the local signal $\hat{x}_j$, and the prediction signal $\bar{x}_j$ of the encoder be equal to the regenerated difference signal $\hat{e}_j$, the decoded signal $\hat{x}_j$, and the prediction signal $\bar{x}_j$ at the current sampling instant j, respectively. In this event, the decoded signal, namely, the decoder output signal $\hat{x}_j$ is substantially equal to the encoder input signal $x_j$ even when the encoder and the decoder are spaced apart from each other. The decoder output signal $\hat{x}_j$ may therefore be called the first digital signal like the encoder input signal $x_j$.

When the internal states of the encoder, such as the prediction coefficients, the step size coefficients $\Delta$, and the like become incoincident with those of the decoder, such incoincidence is naturally recuperated because of the use of the factors $\beta$ and $(1-\delta)$, as known in the art. However, a considerably long time is necessary for recuperation of the incoincidence. This is because the decoder predictor 48 is included in a feedback loop as shown in FIG. 2, like the encoder predictor 21. Interaction between the adaptive prediction and the adaptive quantization and an increase of the prediction coefficients make an incoincident duration longer and longer, as pointed out in the preamble of the instant specification.

An audio signal is assumed to be subjected to pulse code modulation and to be given to the encoder in the form of the encoder input signal succession for transmission. A pause is inevitably included in the audio signal or the speech signal and is considerably longer than a sampling period. It has been found out that such a pause can be effectively utilized so as to make both internal states of the encoder and the decoder quickly coincide with each other. More particularly, quick coincidence can be accomplished by interrupting the adaptive prediction in the encoder and the decoder during the pause. For this purpose, the encoder and the decoder comprise the power calculation circuits 25 and 51 and the interruptign circuits, respectively. Let the internal states of the encoder coincide with those of the decoder when an audio signal is present and sampled at the current sampling instant. In this event, each power signal PW and PW' is greater in electric power than each reference signal RP and RP'. As a result, each of the comparators 31 and 53 gives a logic "1" level as the enable signal EN to each of the AND gates 34 and 57. Responsive to the enable signal EN, each of the AND gates 34 and 57 delivers the prediction and the regenerated prediction signals $\bar{x}_j$ to the subtractor 12 or the adder 44. Thus, the encoder predictor 21 and the decoder predictor 48 are energized at the following sampling instant (j+1) to carry out the adaptive prediction during presence of the audio signal.

The audio signal is assumed to be absent at the current sampling instant j. The local signal $\hat{x}_j$ of the encoder becomes small in the absence of the audio signal, namely, during the pause. Consequently, the power signal PW is not greater in electric power than each reference signal RP. The encoder comparator 31 supplies the encoder AND gate 34 with the logic "0" level as the disable signal at the following sampling instant (j+1). At the following sampling instant (j+1), the encoder input signal which may be represented by $x_{j+1}$ is directly given to the quantizer 13 and is quantized into the encoder output signal which may be indicated at $n_{j+1}$.

Let the internal states of the decoder be different from those of the encoder when the pause begins at the current sampling instant j. It is assumed that the power calculation circuit 51 of the decoder produces, at the current sampling instant j, the power signal PW' greater in electric power than the reference signal RP'. In this event, the decoder comparator 53 supplies the decoder AND gate 57 with the logic "1" level at the following sampling instant (j+1) to make the following regenerated prediction signal $\bar{x}_{j+1}$ pass through the decoder AND gate 57.

At the following sampling instant (j+1), the encoder output signal $n_{j+1}$ which is subjected to no adaption prediction arrives at the decoder input terminal 42 as the decoder input signal $n_{j+1}$. The decoder input signal $n_{j+1}$ is supplied through the inverse quantizer 41 to the adder 44 to be added to the following regenerated prediction signal $\bar{x}_{j+1}$. As a result, an error component increases in the following decoded signal $\hat{x}_{j+1}$ in comparison with the encoder input signal $x_{j+1}$. However, the following regenerated prediction signal $\bar{x}_{j+1}$ is extremely small because the absence of the audio signal begins at the following sampling instant j and the following regenerated prediction signal $\bar{x}_{j+1}$ is produced in consideration of the absence of the audio signal.

Likewise, the following local signal $\hat{x}_{j+1}$ of the encoder becomes very small at the following sampling instant (j+1).

From this fact, it is readily understood that the power signal PW' of the decoder calculation circuit 51 is reduced with time while absence of the audio or speech signal lasts. As mentioned before, such an absent duration of the audio signal is considerably long as compared with a sampling period of the audio signal. Accordingly, the decoder comparator 53 produces the logic "0" level to disable the decoder AND gate 57 at the ensuing sampling instant (j+2) succeeding the following sampling instant (j+1). Thus, the ensuing regenerated prediction signal $\bar{x}_{j+2}$ is interrupted by the decoder AND gate 57 and the adaptive prediction is interrupted in the decoder, although each of the encoder and the decoder predictors 21 and 48 is put into operation during the pause. Anyway, the internal states of the decoder are coincident with those of the encoder during the absence of the audio signal by interruption of the adaptive prediction of each of the encoder and the decoder.

Similar operation is possible by monitoring $\bar{x}_j$, $n_j$, or $e_j$ in the encoder and the decoder.

Inasmuch as the decoder predictor 48 itself has the transfer function P(z) specified by Equation (4), a relationship between the regenerated difference signal succession ê and the decoded signal succession $\hat{x}$ is specified by a transfer function D(z) given by:

$$D(z) = 1/(1 - P(z)) \quad (6)$$

$$= \left(1 - \sum_{i=1}^{k} a_j z^{-i}\right)^{-1}.$$

In Equation (6), each prediction coefficient $a_j$ is calculated with reference to $\hat{e}_j$, as mentioned in conjunction with Equation (4). The prediction coefficients of the decoder predictor 48 are varied from those of the encoder predictor 21 on occurrence of the transmission error or errors. As described in the above-referenced correspondence, Equation (6) has k poles appearing in a unit circle on a z-plane and determined by the respective prediction coefficients. On occurrence of the transmission error, pole positions are often moved outside of the unit circle. In this event, the decoder is put into an unstable state and can not be restored into a normal state, as pointed out in the Nishitani et al article referenced in the preamble of the instant specification.

Figure 4:
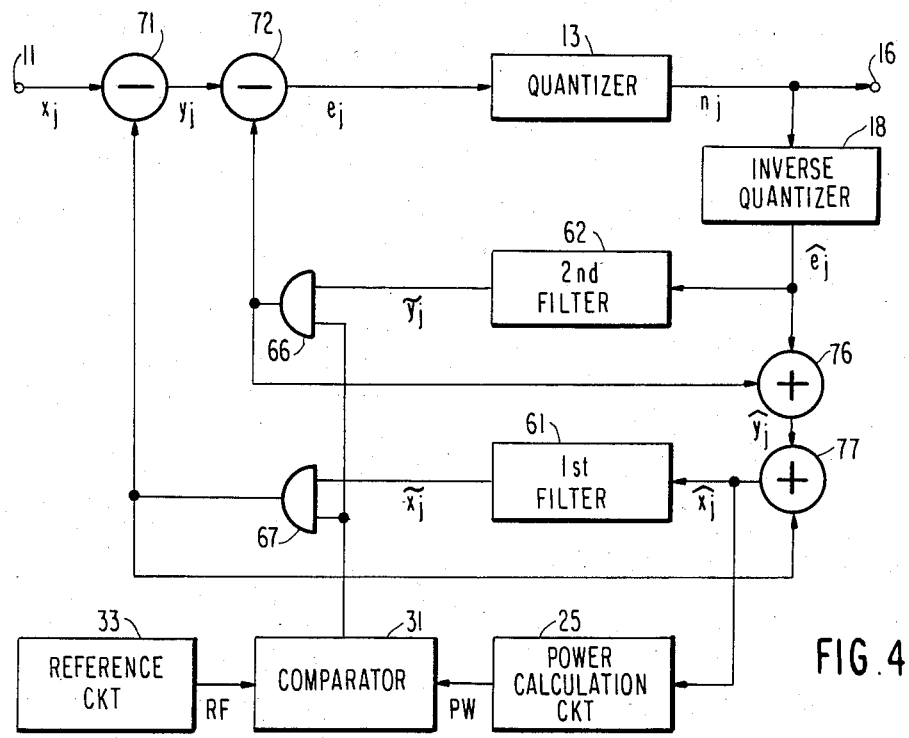
FIG. 4 is a block diagram of an adaptive encoder for use in a conversion method according to a second embodiment of this invention.
Figure 5:
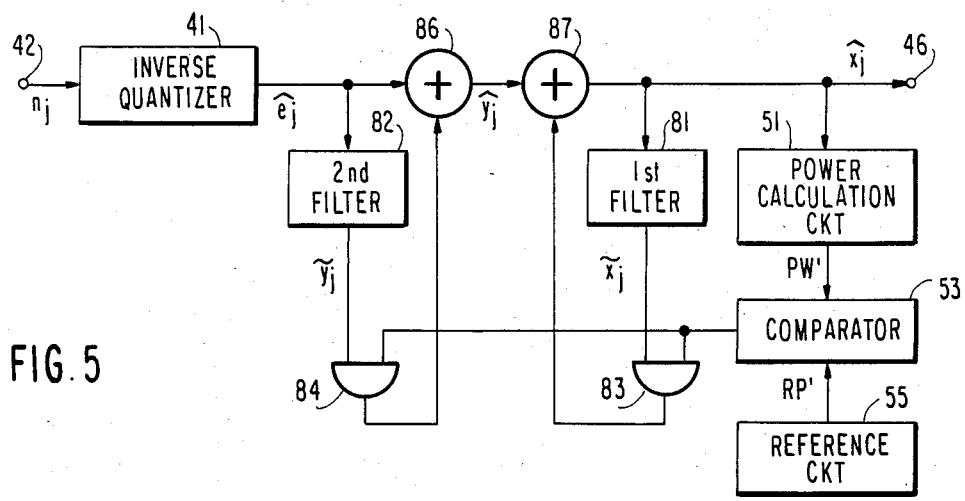
FIG. 5 is a block diagram of an adaptive decoder for use in combination with the adaptive encoder illustrated in FIG. 4.

Referring to FIGS. 4 and 5, a conversion method according to a second embodiment of this invention is carried out by the use of an adaptive encoder (FIG. 4) and a decoder (FIG. 5) and can get rid of the above-mentioned unstable state, as is the case with an ADPCM scheme proposed by the Nishitani et al article. The illustrated encoder and decoder comprise similar parts and signals designated by like reference numerals and symbols. Briefly, adaptive prediction is carried out in the encoder and the decoder by a modified transfer function D'(z) given by:

$$D'(z) = \left(1 - \sum_{i=1}^{k} \hat{a}_i z^{-i}\right)^{-1} \cdot \left(1 + \sum_{i=1}^{M} b_j z^{-i}\right), \quad (7)$$

where $\hat{a}_i$ is representative of a fixed coefficient assigned to an i-th tap and $b_j$, an adaptive coefficient assigned to the i-th tap at the current sampling instant. The first term on the righthand side of Equation (7) has k poles fixed on the z-plane while the second term is a quotient which is obtained by dividing Equation (6) by the first term of Equation (7) and which is truncated at an (M +1)-th term. As a result, the modified transfer function D'(z) has no pole adaptively varied on the z-plane.

In Equation (7), the truncation error can sufficiently become small if each fixed coefficient â is optimized for an average speech in a manner described in "Proceedings of IEEE" (April, 1980), page 498, by J. D. Gibson under the title of "Adaptive prediction in speech differential encoding systems."

More particularly, the illustrated encoder comprises a first encoder filter 61 having a plurality of taps assigned with the fixed coefficients â, respectively, and a first transfer function $P_1(z)$ given by:

$$P_1(z) = \sum_{i=1}^{k} \hat{a}_i z^{-1}. \tag{8}$$

The first encoder filter 61 may be called a fixed filter having the fixed coefficients â.

A second encoder filter 62 which is responsive to the reproduced difference signals ê has a plurality of taps assigned with the adaptive coefficients $b^j$, respectively, and a second transfer function $P_2(z)$ given by:

$$P_2(z) = \sum_{i=1}^{M} b_i^j z^{-i}. \tag{9}$$

The second encoder filter 62 may be referred to as an adaptive filter. In order to minimize electric power of the reproduced difference signals ê, the adaptive coefficients $b^j$ are modified in the manner described in the Nishitani et al article by:

$$b_i^{j+1} = (1-\delta)b_i^j + g\hat{e}_{j-i} \cdot \hat{e}_j. \tag{10}$$

At any rate, the first and the second encoder filters 61 and 62 serve to produce first and second partial prediction signals $\bar{x}$ and $\bar{y}$, respectively. A combination of the first and the second partial prediction signals $\bar{x}$ and $\bar{y}$ correspond to the prediction signals $\bar{x}$ illustrated in FIG. 1. Therefore, a combination of the first and the second encoder filters 61 and 62 may be referred to as an encoder predictor.

The illustrated encoder is similar to that described in the above-referenced article except that the encoder calculation circuit 25 is included in the illustrated encoder together with those of the encoder comparator 31, the encoder reference circuit 33, and first and second encoder AND gates 66 and 67 which are all operable as an encoder interruption circuit as described in conjunction with FIG. 1.

Operation will briefly be described as regards the encoder on the assumption that the encoder calculation circuit 25 and the encoder interruption circuit are removed from FIG. 4. Let the encoder input signal $x_j$ be supplied through the encoder input terminal as a first digital signal to a first subtractor 71. Supplied with a current one $\bar{x}_j$ of the partial prediction signals from the first encoder filter 61, the first subtractor 71 subtracts the first partial prediction signal $\bar{x}_j$ from the encoder input signal $x_j$ to produce an intermediate signal $y_j$ representative of a result of subtraction. A second subtractor 72 subtracts a current one $\bar{y}_j$ of the second partial prediction signals from the intermediate signal $y_j$ to produce an error signal $e_j$ representative of a difference between the intermediate signal $y_j$ and the second partial prediction signal $\bar{y}_j$. Thus, the second partial prediction signal $\bar{y}_j$ is predictive of the intermediate signal $y_j$ and is given from the second encoder filter 62 in a manner to be described. The error signal $e_j$ may be called a difference signal, like in FIG. 1, and is quantized into a quantized signal by the quantizer 13 in the manner described in conjunction with FIG. 1. The quantized signal is delivered as the encoder output signal $n_j$ to the encoder output terminal 16 and to the inverse quantizer 18. The encoder output signal $n_j$ may be called a second digital signal.

The encoder output signal $n_j$ is inversely quantized into a reproduced error or difference signal $\hat{e}_j$, like in FIG. 1. The reproduced error signal $\hat{e}_j$ is supplied to the second encoder filter 62 and to the first encoder filter 61 through first and second adders 76 and 77.

The second encoder filter 62 adaptively varies the adaptive coefficients b in response to the reproduced error signal $\hat{e}_j$ to produce the following one $\bar{y}_{j+1}$ of the second partial prediction signals determined by Equation (9) at the following sampling instant (j+1).

At the current sampling instant j, the second partial prediction signal $\bar{y}_j$ is delivered to the second subtractor 72 and to the first adder 76. The first adder 76 adds the second partial prediction signal $\bar{y}_j$ to the reproduced error signal $\hat{e}_j$ to supply the second adder 77 with a reproduced intermediate signal $\hat{y}_j$ representative of a reproduction of the intermediate signal $y_j$.

The second adder 77 sums up the reproduced intermediate signal $\hat{y}_j$ and the first partial prediction signal $\bar{x}_j$ to produce a reproduced encoder input signal $\hat{x}_j$ representing a reproduction of the encoder input signal $x_j$. The reproduced encoder input signals $\hat{x}$ may be referred to as local signals.

The first partial prediction signal $\bar{x}_j$ is determined by Equation (8) and is delivered at the current sampling instant from the first encoder filter 61 to the first subtractor 71 and the second adder 77. Responsive to the first partial prediction signal $\bar{x}_j$ at the current sampling instant j, the first encoder filter 61 is put into operation to produce the following one $\bar{x}_{j+1}$ of the first partial prediction signal in accordance with Equation (8).

Inasmuch as the fixed coefficients â of the first encoder filter 61 are selected for an average speech to be transmitted, an amplitude of the intermediate signal $y_j$ is reduced in comparison with the encoder input signal $x_j$ by subtraction of the first partial prediction signal $\bar{x}_j$ from the encoder input signal $x_j$. An amplitude of the error signal $e_j$ is further reduced as compared with the amplitude of the intermediate signal $y_j$ by subtraction of the second partial prediction signal $\bar{y}_j$ from the intermediate signal $y_j$.

Operation of the encoder calculation circuit 25 and the encoder interruption circuit will be described in conjunction with that of the decoder illustrated in FIG. 5.

In FIG. 5, the illustrated decoder comprises similar parts designated by like reference numerals and symbols and is similar in operation and structure to that described in the Nishitani et al article except that the decoder calculation circuit 51 and the decoder interruption is added to the illustrated decoder. The decoder interruption circuit comprises the decoder comparator 53, the decoder reference circuit 55, and first and second decoder AND gates 83 and 84 connected to the first and the second decoder filters 81 and 82, respectively.

More specifically, the decoder comprises a first decoder filter 81 and a second decoder filter 82 which produce first and second filter output signals in accordance with the first and the second transfer functions $P_1(z)$ and $P_2(z)$ specified by Equations (8) and (9), respectively. The first and the second decoder filters 81 and 82 may be called fixed and adaptive filters like the first and the second encoder filters 61 and 62, respectively. As a result, the first and the second filter output signals are regenerations of the first and the second partial prediction signal x̄ and ȳ, respectively, and are therefore represented by x̄ and ȳ, respectively.

The encoder output signals n arrive as the decoder input signals through a transmission line (not shown) at the decoder input terminal 42 and may be referred to as the second digital signals. At the current sampling instant j, the decoder input signal denoted by $n_j$ in FIG. 5 is inversely quantized into a regenerated error signal $ê_j$ which is representative of a regeneration of the error signal $e_j$ and which is identical with the reproduced error signal $ê_j$ (FIG. 4) when no transmission error takes place.

The regenerated error signal $ê_j$ is delivered to a first adder 86 which is supplied with the second filter output signal $ȳ_j$ at the current sampling instant j. Simultaneously, the regenerated error signal $ê_j$ is delivered also to the second decoder filter 82 to calculate the following one $ȳ_{j+1}$ of the second filter output signals like the second encoder filter 62 and to produce the following second filter output signal $ȳ_{j+1}$ at the following sampling instant (j+1).

The second filter output signals ȳ are forwardly sent to the first adder 86 through the second decoder AND gate 84 operated in a manner to be described later, when the second decoder AND gate 84 is opened. Thus, the second decoder filter 82 is included in a forward loop.

At the current sampling instant j, the first decoder adder 86 adds the regenerated error signal $ê_j$ to the second filter output signal $ȳ_j$ to supply a second decoder adder 87 with a regenerated intermediate signal $ŷ_j$ standing for a regeneration of the intermediate signal $y_j$. A relationship or a transfer function $T_1$ between the regenerated error signal $ê_j$ and the regenerated intermediate signal $ŷ_j$ is defined by:

$$T_1 = 1 + P_2(z). \tag{11}$$

The second decoder adder 87 is connected to the first decoder filter 81 included in a feedback loop. The first filter output signal $x̄_j$ is given through the first decoder AND gate 83 and is a regeneration of the first partial prediction signal $x̄_j$ (FIG. 4), as mentioned before. Addition of the first filter output signal $x̄_j$ to the reproduced intermediate signal $ŷ_j$ provides a decoded signal which is a reproduction of the encoder input signal $x_j$ and which is produced as a decoder output signal $x̂_j$ through the decoder output terminal 46. The decoder output signal $x̂_j$ may be called the first digital signal like the encoder input signal.

The decoder output signal $x̂_j$ is delivered to the first decoder filter 81 having the first transfer function $P_1(z)$ given by Equation (8). The first filter output signal $x̄_j$ is fed back to the second decoder adder 87. Under the circumstances, a relationship or a transfer function $T_2$ between the reproduced intermediate signal $ŷ_j$ and the decoder output signal $x̂_j$ is given by:

$$T_2 = (1 - P_1(z))^{-1}. \tag{12}$$

As a result, a relationship between the reproduced error signal $ê_j$ and the decoder output signal $x̂_j$ is defined with reference to Formulae (11) and (12) by the following transfer function D''(z):

$$D''(z) = (1 + P_2(z))(1 - P_1(z))^{-1}. \tag{13}$$

It is readily understood that Equation (13) is equivalent to Equation (7) and that the illustrated decoder has no poles adaptively moved on the z-plane. Accordingly, stable operation can be achieved by the use of the encoder and the decoder illustrated in FIGS. 4 and 5 even on occurrence of any transmission bit error.

However, once noncoincidence of internal states takes place between the encoder and the decoder, the noncoincidence is not promptly remedied because both of the first encoder filter 61 and the first decoder filter 81 are included in the feedback loops, as mentioned in the preamble of the instant specification.

In order to promptly remedy the noncoincidence, the encoder and the decoder comprise the power calculating circuits 25 and 51 and the interrupting circuits, respectively, like in FIGS. 1 and 2.

Each of the encoder and the decoder calculation circuits 25 and 51 is equal in structure to that illustrated in FIG. 3. The encoder calculation circuit 25 is supplied with the local signal $x̂_j$ to produce a power signal PW representative of electric power of the local signal $x̂_j$. When the power signal PW has a greater electric power than a reference power signal RF given from the encoder reference circuit 33, the encoder comparator 31 enables the first and the second encoder AND gates 66 and 67 by producing the logic "1" level. As a result, the encoder is put intp operation in the above-mentioned manner.

Likewise, the decoder comparator 53 delivers the logic "1" level to the first and the second AND gates 83 and 84 as long as the decoder power signal PW' is greater in electric power than a decoder reference signal RP' produced by the decoder reference circuit 55. Therefore, the decoder is operable in the foregoing manner.

Let noncoincidence of the internal states occur between the illustrated encoder and decoder for some reason. The noncoincidence can be recovered in absence of a speech, namely, during the pause accompanying the audio signal given in the form of the encoder input signal succession x. Under the circumstances, it is assumed that the pause occurs at the current sampling instant j and that the local signal $x̂_j$ is lowered in electric power than the encoder reference signal RF at the current sampling instant j. In this event, the encoder comparator 31 produces the logic "0" level as the disable signal at the following sampling instant (j+1). Responsive to the disable signal, the first and the second encoder AND gates 66 and 67 are closed to deliver zero to the first and the second subtractors 71 and 72 at the following sampling instant. No subtraction is carried out in the first and the second subtractors 71 and 72 at the following sampling instant (j+1). This means that prediction is interrupted in the following sampling instant (j+1). Accordingly, the following encoder input signal $x_{j+1}$ is supplied direct to the quantizer 13 and quantized into the following encoder output signal $n_{j+1}$. Inasmuch as the following encoder input signal $x_{j+1}$ is very small in amplitude during the pause, the following encoder output signal $n_{j+1}$ becomes very small.

Inasmuch as the noncoincidence takes place between the encoder and the decoder, the decoder has the internal states different from those of the encoder at the current sampling instant j. Herein, it is surmised that the decoder calculation circuit 51 supplies the decoder comparator 53 with the decoder power signal PW' higher in electric power than the reference power signal RF' at the current sampling instant j. The decoder comparator 53 delivers the logic "1" level to the first and the second AND gates 83 and 84 at the following sampling instant (j+1).

The first and the second filter output signals $\bar{x}_{j+1}$ and $\bar{y}_{j+1}$ are sent to the second and the first decoder adders 87 and 86 at the following sampling instant (j+1), respectively. In this event, the following encoder output signal $n_{j+1}$ which is not subjected to the prediction appears at the following sampling instant (j+1) as the following decoder input signal $n_{j+1}$ and is inversely quantized into the following regenerated error signal $\hat{e}_{j+1}$. The first decoder adder 86 sums up the following regenerated error signal $\hat{e}_{j+1}$ and the following one $\bar{y}_{j+1}$ of the second filter output signal to produce the following regenerated intermediate signal $\hat{y}_{j+1}$. The following regenerated intermediate signal $\hat{y}_{j+1}$ is added to the following one of the first filter output signal by the second decoder adder 87 to be produced as the following decoded signal $\hat{x}_{j+1}$. An error signal component in the following decoded signal $\hat{x}_{j+1}$ may become large in comparison with the following encoder input signal $x_{j+1}$. However, the first and the second filter output signals promptly decrease with time during the pause which lasts for a long time as compared with the sampling period. As a result, the decoded signal is rapidly reduced during the pause and is delivered to the decoder calculation circuit 51. The decoder calculation circuit 51 produces the decoder power signal PW' lower in electric power than the decoder reference signal RF' to make the decoder comparator 53 deliver the logic "0" level. Thus, the first and the second AND gates 83 and 84 are closed to supply zero to the second and the first decoder adders 87 and 86, respectively.

When the first and the second AND gates 66 and 67 are closed in the encoder (FIG. 4), subtraction of zero is continued in the first and the second subtractors 71 and 72 during the pause. Each encoder input signal is directly quantized by the quantizer 13 into each encoder output signal during the subtraction of zero. Accordingly, each local signal supplied to the encoder calculation circuit 25 is determined by the internal states of the inverse quantizer 18 which are dependent on the encoder output signal succession given from the quantizer 13.

Likewise, when the first and the second AND gates 83 and 84 are closed in the decoder (FIG. 5), addition of zero is carried out in the first and the second adders 86 and 87. Each regenerated error signal is directly produced as each decoded signal during the addition of zero and is delivered to the decoder output terminal 46 and to the decoder calculation circuit 51. From this fact, it is seen that each decoded signal is determined by the internal states of the inverse quantizer 41.

Thus, the above-mentioned operation is specified by the adaptive forward and backward quantization carried out in the quantizer 13 and the inverse quantizers 18 and 41. Such adaptive quantization is specified by the step size $\Delta$ as shown in Equation (2). The step sizes $\Delta$ should become equal to each other in the encoder and the decoder so as to insure coincidence of the internal states between the encoder and the decoder. The coincidence is insured with a lapse of time by the preselected number $\beta$ as long as the adaptive quantization is carried out in accordance with Equation (2).

Strictly, the internal states of the first and the second encoder filters 61 and 62 should coincide with those of the first and the second decoder filters 81 and 82 during the absence of speech, respectively. However, such coincidence is automatically accomplished on the coincidence of the step sizes $\Delta$ in the encoder and the decoder when the AND gates 66, 67, 86, and 87 are closed. More specifically, the input signals of the first and the second encoder filters 61 and 62 are automatically coincident with those of the first and the second decoder filters 81 and 82 when the step size $\Delta$ of the inverse quantizer 18 coincides with that of the inverse quantizer 41. In addition, the adaptive coefficients of the second encoder filter 62 become equal to those of the second decoder filter 82 on the coincidence of the step sizes $\Delta$.

Anyway, all of the internal states of the encoder are coincident with those of the decoder.

Thus, the prediction is interrupted during the pause in the encoder and the decoder by prohibiting or stopping each output signal of the filters 61, 62, 81, and 82 with each filter put into operation.

Under the circumstances, when the audio signal begins to arrive at the encoder input terminal 11 after the end of the pause, electric power of the local signal $\hat{x}$ increases in synchronism with that of the decoded signal $\hat{x}$. Thus, the encoder comparator 31 and the decoder comparator 53 synchrohously produce the logic "1" level to synchronously open the AND gates 66 and 67 and the AND gates 83 and 84. Thereafter, operation is again carried out in the manner described before.

If stability of operation is kept in the decoder, each of the first encoder filter 61 and the first decoder filter 81 may be an adaptive filter like the second encoder and the second decoder filters 62 and 82. Use of the adaptive filters serves to make the internal states of the encoder coincide with those of the decoder at a high speed.

The encoder calculation circuit 25 may monitor a sum of the first and the second partial prediction signals $\bar{x}$ and $\bar{y}$ instead of the local signal $\hat{x}$. Likewise, the decoder calculation circuit 51 may monitor a sum of the first and the second filter output signals $\bar{x}$ and $\bar{y}$. Such a sum is equivalent to the prediction $\bar{x}$ illustrated in FIGS. 1 and 2 and may therefore be called a prediction signal.

Alternatively, the encoder and the decoder calculation circuits 25 and 51 may monitor the encoder output signal and the decoder input signal which are subjected to adaptive differential pulse code modulation. This is because there is a high possibility that a code of a low amplitude is selected as each of the encoder output signal and the decoder input signal during the pause. The selection of the low amplitude code results from the fact that the step size $\Delta$ increases during the pause in comparison with a necessary value on account of the preselected number $\beta$. More specifically, the preselected number $\beta(\leq 1)$ contributes to the increase of the step size $\Delta$ when the step size $\Delta$ is smaller than unity, as readily understood from Equation (2), and as a result, the low amplitude code is selected as each of the encoder output signal and the decoder input signal.

Referring to FIG. 6, an adaptive quantizer is operable as the quantizer 13 illustrated in FIG. 4 to quantize the error signal $e_j$ into the quantized signal $n_j$ by adaptively varying the step size $\Delta$, in accordance with Equation (2). The illustrated quantizer 13 comprises a divider 91 for dividing the error signal $e_j$ by the current step size $\Delta_j$ at the current sampling instant j to give a result of division and a fixed quantizer 92 for quantizing the result of division into the quantized signal $n_j$ with reference to a fixed step size in a known manner. The quantized signal $n_j$ is sent as the encoder output signal to the decoder and is also delivered to a memory 93. The memory 93 memorizes multipliers M shown in Table 2 and produces a selected one $M(n_j)$ of the multipliers in response to the quantized signal $n_j$. The selected multiplier $M(n_j)$ is delivered to a multiplication circuit 94 supplied with the current one $\Delta_j^\beta$ of the step size. The multiplication circuit 94 multiplies the current step size $\Delta_j$ by the selected multiplier $M(n_j)$ to produce a modified step size $\Delta_m$ represented by $\Delta_j^\beta \cdot M(n_j)$. The modified step size $\Delta_m$ is delayed a single sampling period by a delay circuit 95 to be delivered as the subsequent step size $\Delta_{j+1}$ to the divider 91 and a factor circuit 96. The factor circuit 96 carries out calculation of $\Delta_{j+1}$ to $\beta$ power to give $\Delta_{j+1}^\beta$ to the multiplication circuit 94.

In the example being illustrated, the modified step size $\Delta_m$ may be sent to the power calculation circuit 25. Similar operation is possible by monitoring the modified step size $\Delta_m$ in the power calculation circuit 25. This is because each modified step size $\Delta_m$ is adaptively varied in accordance with each encoder input signal x and is therefore dependent on each encoder input signal x.

Referring to FIG. 7, an adaptive inverse quantizer is used as each of the inverse quantizers 18 and 41. The illustrated inverse quantizer is supplied with an input signal $n_j$ subjected to ADPCM to produce an output signal denoted by $ê_j$ like in FIGS. 4 and 5. The input signal $n_j$ is subjected to inverse quantization by an inverse quantizer 101 having a fixed step size. Simultaneously, the input signal $n_j$ is delivered to a memory circuit 102 to derive a selected one $M(n_j)$ of the multipliers (Table 1) from the memory circuit 102.

The selected multiplier $M(n_j)$ is sent to a first multiplication circuit 103 supplied with $\Delta_j^\beta$ from a factor circuit 104. The first multiplication circuit 103 carries out multiplication of $\Delta_j^\beta$ and the selected multiplier $M(n_j)$ to produce a modified step size $\Delta_m$ represented by $M(n_j) \cdot \Delta_j^\beta$. The modified step size $\Delta_m$ is delivered through a delay unit 105 to the factor circuit 104 and to the second multiplication circuit 107 as a subsequent step size $\Delta_{j+1}$. The factor circuit 104 is put into operation in a manner similar to the factor circuit 96 illustrated in FIG. 6.

The modified step size $\Delta_m$ may be delivered to the encoder calculation circuit 25 or the decoder calculation circuit 51 so as to interrupt prediction in each of the encoder and the decoder.

While this invention has thus far been described in conjunction with a few embodiments thereof, it will readily be possible for those skilled in the art to put this invention into practice in various other manners. For example, prediction may be interrupted or prohibited by resetting the first and the second encoder filters 61 and 62 and the first and the second decoder filters 81 and 82 to put all of the internal states into reset states and to make the internal states of the encoder and the decoder coincide with each other, when each of the comparators 31 and 53 produces the logic "0" level. Only the adaptive coefficients of each adaptive filter may be reset in the encoder and the decoder when the logic "0" level is produced by each comparator. Such resetting of the adaptive coefficients is very useful when all of the filters 61, 62, 81, and 82 are adaptive because zero is produced as each prediction value in the reset states of the adaptive filters. The electric signal to be monitored by each power calculation circuit 25 and 51 may be $ê_j$. Each of the comparators 31 and 53 may be a comparator which has an adaptive threshold level as described by J. A. Jankowski in "COMSAT TECHNICAL REVIEW", Vol. 6, pages 156–176 (1976) published by COMSAT.

What is claimed is:

1. A code conversion method comprising the steps of:
   carrying-out conversion between a succession of first signals and a succession of second signals;
   producing a succession of prediction signals predictive of said first signal succession by the use of adaptive prediction means for successively carrying-out adaptive prediction of said first signal succession;
   calculating the electric power of an electric signal succession related to a preselected one of said first and said second signal successions to produce a power signal representative of said electric signal; and
   interrupting said adaptive prediction when the level of said electric power is not greater than a preselected electric power level.

2. A code conversion method as claimed in claim 1, said conversion carrying-out step comprising an encoding step carried out in an encoder comprising said adaptive prediction means as encoder prediction means, said encoding step being for encoding the first signal succession given as an encoder input signal succession into the second signal succession produced as one encoder output signal succession, said encoding step comprising the steps of:
   producing, as said prediction signal succession, a succession of encoder prediction signals predictive of said encoder input signal succession from said encoder output signal succession, respectively, said encoder prediction signal succession being produced as a result of said adaptive prediction;
   subtracting said encoder prediction signal succession from said encoder input signal succession to produce a succession of difference signals representative of differences between said encoder prediction signal succession and said encoder input signal succession; and
   forwardly quantizing said difference signal succession into said encoder output signal succession.

3. A code conversion method as claimed in claim 2, wherein:
   said calculating step comprises the steps of:
   monitoring said encoder output signal succession as said electric signal succession; and
   carrying out calculation to attain said power signal from said encoder output signal succession.

4. A code conversion method as claimed in claim 2, wherein said prediction signal producing step comprises the steps of:
   inversely quantizing said encoder output signal succession into a succession of reproduced difference signals representative of reproductions of said difference signals; and
   deriving said encoder prediction signal succession from said reproduced difference signal succession.

5. A code conversion method as claimed in claim 4, wherein said prediction signal deriving step comprises the steps of:
   summing up said prediction signal succession and said reproduced difference signal succession to produce a succession of local signals representative of reproductions of said encoder input signal succession; and
   forming said encoder prediction signal succession from said local signal succession.

6. A code conversion method as claimed in claim 4, wherein:

said prediction signal deriving step comprising the steps of:
producing a first partial succession as a part of said encoder prediction signal succession from a succession of local signals;
producing a second partial succession as another part of said encoder prediction signal succession from said reproduced difference signal succession; and
adding said first and said second partial successions to said reproduced difference signal succession to form said local signal succession;
said interrupting step comprising the step of:
interrupting said first and said second partial successions when said electric power is not greater than said preselected electric power;
said subtracting step comprising the steps of:
partially subtracting said first partial succession from said encoder input signal succession to produce an intermediate signal succession which corresponds to said second partial succession and which represents a difference therebetween; and
partially subtracting said second partial succession from said intermediate signal succession to produce, as said difference signal succession, an error signal succession representative of differences between said second partial succession and said intermediate succession.

7. A code conversion method as claimed in claim 6, wherein said calculating step comprises the steps of:
monitoring said local signal succession as said electric signal succession; and
carrying out calculation of said electric power of said local signal succession to produce said power signal.

8. A code conversion method as claimed in claim 1, said conversion carrying-out step comprising a decoding step carried out in a decoder comprising said prediction means as decoder prediction means, said decoding step being for decoding the second signal succession given as a decoder input signal into the first signal succession produced as a decoder output signal succession, wherein said decoding step is carried out in accordance with a predetermined transfer function D(z) represented by z-transform.

9. A code conversion method as claimed in claim 8, said decoder prediction means being specified by the number of taps and adaptive coefficients assigned to the respective taps at a current time instant j, wherein:
said predetermined transfer function D(z) is given by:

$$D(z) = \left(1 - \sum_{i=1}^{k} a_i^j z^{-i}\right)^{-1},$$

where k represents the number of said taps and $a_i^j$, the adaptive coefficients assigned to said taps at said current time instant j.

10. A code conversion method as claimed in claim 8, said decoder prediction means comprising a first portion specified by the number k of first taps and fixed coefficients $\hat{a}$ assigned to said first taps and a second portion specified by the number M of second taps and adaptive coefficients $b^j$ assigned to said second taps at a current timing instant, said first portion having a first transfer function $P_1(z)$ given by:

$$P_1(z) = \sum_{i=1}^{k} \hat{a}_i z^{-i},$$

said second portion having a second transfer function $P_2(z)$ given by:

$$P_2(z) = \sum_{i=1}^{M} b_i^j z^{-i},$$

wherein said predetermined transfer function D(z) is defined by:

$$D(z) = (1 + P_2(z))(1 - P_1(z))^{-1}.$$

11. A code conversion method as claimed in claim 8, wherein:
said calculating step comprises the steps of:
monitoring said decoder output signal succession as said electric signal succession; and
producting said power signal from said decoder output signal succession.

12. A code conversion method as claimed in claim 1, said conversion carrying-out step comprising an encoding step carried out in an encoder to encode the first signal succession into the second signal succession and a decoding step carried out in a decoder to decode the second signal succession into the first signal succession, wherein said electric power calculating and said interrupting steps are carried out during each of said encoding and said decoding steps.

13. A code conversion method as claimed in claim 5, wherein said calculating step comprises the steps of:
monitoring said local signal succession as said electric signal succession; and
calculating the electric power of said local signal succession to produce said power signal.

14. An encoder for use in encoding a succession of encoder input signals into a succession of encoder output signals, said encoder comprising:
encoding means for encoding said encoder input signal succession into said encoder output signal succession by successively carrying-out encoder adaptive prediction of said encoder input signal succession with reference to a succession of prediction signals predictive of said encoder input signal succession internally produced in said encoding means;
encoder calculating means coupled to said encoding means for calculating electric power related to said encoder output signal succession to produce a power signal representative of said electric power; and
encoder interrupting means coupled to said encoding means and said encoder calculating means for interrupting said encoder adaptive prediction when said electric power is not greater than a preselected electric power.

15. An encoder as claimed in claim 14, wherein said encoder calculating means is supplied with said encoder output signal succession as said electric signal succession.

16. An encoder as claimed in claim 15, wherein said encoding means comprises:
local signal producing means responsive to said encoder output signal succession and said prediction signal succession for producing a succession of encoder local signals representative of local reproductions of said encoder input signal succession, respectively; and encoder prediction means responsive to said encoder local signal succession for delivering said prediction signal succession to said interrupting means and said local signal producing means by carrying-out said adaptive prediction of said encoder input signal succession.

17. An encoder as claimed in claim 16, wherein said encoder calculating means is supplied with said local signal succession as said electric signal succession.

18. An encoder as claimed in claim 17, wherein said encoder interrupting means comprises:

encoder reference means for producing an encoder reference signal representative of said preselected electric power;

comparing means for comparing said encoder local signal succession with said reference signal to produce an enable signal only when said electric power is greater than said predetermined reference power; and gating means for allowing said prediction signal succession to pass therethrough in response to said enable signal to interrupt said prediction signal succession in the absence of said enable signal.

19. An encoder as claimed in claim 18, wherein said encoder prediction means comprises:

subtracting means coupled to said gating means for carrying-out subtraction between the prediction signal succession and said encoder input signal succession to produce said encoder output signal succession only when the prediction signal succession is given through said gating means and, otherwise, for producing said encoder input signal succession as said encoder output signal succession;

an encoder predictor coupled to said subtracting means for carrying-out said adaptive prediction of said encoder input signal succession in response to said encoder local signal succession to produce said prediction signal succession; and means for supplying said prediction signal succession to said interrupting means and said local signal producing means.

20. An encoder as claimed in claim 19, wherein said encoder predictor comprises:

first means responsive to a succession of subsidiary signals related to said encoder output signal succession for producing a first partial succession as a part of said prediction signal succession;

second means responsive to said encoder output signal succession for producing a second partial succession as the other part of said prediction signal succession; and third means coupled to said first and said second means for producing said subsidiary signal succession with reference to said first and said second partial successions and said encoder output signal succession; and means for supplying said encoder monitoring means with said subsidiary signal succession as said electric signal succession.

21. A decoder for use in decoding a succession of decoder input signals into a succession of decoder output signals, said decoder comprising:

decoding means for decoding said decoder input signal succession into said decoder output signal succession by successively carrying-out decoder adaptive prediction with reference to a succession of decoder prediction signals for predicting said decoder output signal succession;

decoder calculating means coupled to said decoding means for calculating electric power related to said decoder output signal succession to produce a power signal representative of said electric power; and decoder interrupting means coupled to said decoding means and said decoder calculating means for interrupting said decoder adaptive prediction when said electric power is not greater than a preselected electric power.

22. A decoder as claimed in claim 21, wherein said decoder output signal succession is supplied to said decoder calculating means as said electric signal succession.

23. A decoder as claimed in claim 22, wherein said decoder interruption means comprises:

decoder reference means for producing a decoder reference power signal representative of said preselected electric power;

comparing means responsive to said reference power signal and said power signal for comparing said electric power of said decoder output signal succession given as said electric signal succession to produce a disable signal when said electric power is not greater than said preselected electric power; and disabling means responsive to said disable signal for disabling said decoder prediction signal succession to interrupt said adaptive prediction.

24. A decoder as claimed in claim 23, wherein said decoding means comprises:

a decoder predictor for carrying-out said decoder adaptive prediction in accordance with said predetermined transfer function to produce said decoder prediction signal succession; and decoder signal producing means responsive to said decoder input signal succession and coupled to said decoder predictor for producing said decoder output signal succession.

25. A decoder as claimed in claim 24, said decoder input signal succession being obtained by quantizing a succession of error signals which can be reproduced by said decoder adaptive prediction into said decoder output signal succession, wherein said decoder signal producing means comprises:

inverse quantization means for inversely quantizing said decoder input signal succession into reproductions of said error signals;

adding means coupled to said decoder predictor and said inverse quantization means for adding said reproductions of the error signals to said decoder prediction signal succession to produce said decoder output signal succession.

26. A decoder as claimed in claim 25, wherein said adding means comprises:

a first adder for adding said reproductions to a succession of intermediate signals to produce a succession of first sum signals representative of sums of said reproductions and said intermediate signals, respectively;

a second adder for adding said first sum signal succession to a succession of additional signals to produce a succession of second sum signals representative of sums of said first sum signal succession and said additional signal succession; and means for producing said second sum signal succession as said decoder output signal succession;
said decoder predictor comprising:
first filter means responsive to said decoder output signal succession for producing first filter output signals as said additional signal succession in accordance with a first transfer function; and
second filter means responsive to said reproductions of the error signals for producing second filter output signals as said intermediate signal succession in accordance with a second transfer function.

* * * * *

UNITED STATES PATENT AND TRADEMARK OFFICE
CERTIFICATE OF CORRECTION

PATENT NO. : 4,626,828

DATED : December 2, 1986

INVENTOR(S) : Takao Nishitani

It is certified that error appears in the above-identified patent and that said Letters Patent is hereby corrected as shown below:

On the Title Page /73/ Assignee should read:
[73] Assignee: NEC Corporation, Tokyo, Japan Signed and Sealed this Twenty-first Day of April, 1987

Attest:

DONALD J. QUIGG

*Attesting Officer*    *Commissioner of Patents and Trademarks*

UNITED STATES PATENT AND TRADEMARK OFFICE
CERTIFICATE OF CORRECTION

PATENT NO. : 4,626,828
DATED : December 2, 1986
INVENTOR(S) : Takao NISHITANI

It is certified that error appears in the above-identified patent and that said Letters Patent is hereby corrected as shown below:

Column 3, line 8, delete "A" and insert --If--;

Column 3, line 52, after "signals" insert --ê--;

Column 4, Equation (5) "e" should read --ê--;

Column 4, line 50, after "succession" insert $\hat{x}$;

Column 5, line 48, delete "e" insert --ê--;

Column 12, line 26, delete "intp" and insert --into--.

Signed and Sealed this

Sixth Day of October, 1987

Attest:

DONALD J. QUIGG

Attesting Officer

Commissioner of Patents and Trademarks